(12) United States Patent
Park et al.

(10) Patent No.: US 7,927,932 B2
(45) Date of Patent: Apr. 19, 2011

(54) SEMICONDUCTOR DEVICE HAVING A PLURALITY OF STACKED TRANSISTORS AND METHOD OF FABRICATING THE SAME

(75) Inventors: Han-Byung Park, Seongnam-si (KR); Soon-Moon Jung, Seongnam-si (KR); Hoon Lim, Seoul (KR); Cha-Dong Yeo, Suwon-si (KR); Byoung-Keun Son, Suwon-si (KR); Jae-Joo Shim, Suwon-si (KR); Chang-Min Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/923,471

(22) Filed: Sep. 23, 2010

(65) Prior Publication Data

US 2011/0014754 A1 Jan. 20, 2011

Related U.S. Application Data

(62) Division of application No. 12/219,278, filed on Jul. 18, 2008, now Pat. No. 7,825,472.

(30) Foreign Application Priority Data

Jul. 20, 2007 (KR) .................. 10-2007-0072964

(51) Int. Cl.
*H01L 21/84* (2006.01)
(52) U.S. Cl. ............. 438/153; 257/351; 257/E21.632; 257/E27.062
(58) Field of Classification Search .......... 257/351, 257/E21.632, E27.062; 438/153
See application file for complete search history.

(56) References Cited

U.S. PATENT DOCUMENTS

| 6,429,484 | B1 | 8/2002 | Yu |
| 2003/0062555 | A1 | 4/2003 | Miyai et al. |
| 2006/0028861 | A1 | 2/2006 | Han et al. |
| 2006/0208299 | A1 | 9/2006 | Yang |
| 2006/0220134 | A1 | 10/2006 | Huo et al. |
| 2009/0008691 | A1 | 1/2009 | Lee et al. |

FOREIGN PATENT DOCUMENTS

| JP | 2006-270101 | 10/2006 |
| KR | 10-2004-0034107 | 4/2004 |
| KR | 2006-0101685 | 9/2006 |
| KR | 10-0634459 | 10/2006 |

*Primary Examiner* — Bradley K Smith
*Assistant Examiner* — Marvin Payen
(74) *Attorney, Agent, or Firm* — Harness, Dickey & Pierce, P.L.C.

(57) ABSTRACT

A semiconductor device according to example embodiments may have a plurality of stacked transistors. The semiconductor device may have a lower insulating layer formed on a semiconductor substrate and an upper channel body pattern formed on the lower insulating layer. A source region and a drain region may be formed within the upper channel body pattern, and a non-metal transfer gate electrode may be disposed on the upper channel body pattern between the source and drain regions. The non-metal transfer gate electrode, the upper channel body pattern, and the lower insulating layer may be covered by an intermediate insulating layer. A metal word line may be disposed within the intermediate insulating layer to contact at least an upper surface of the non-metal transfer gate electrode. An insulating spacer may be disposed on a sidewall of the metal word line. A metal node plug may be disposed within the intermediate insulating layer and the lower insulating layer to contact the source region of the upper channel body pattern. Example embodiments also relate to a method of fabricating the above semiconductor device.

12 Claims, 9 Drawing Sheets

SEMICONDUCTOR DEVICE HAVING A PLURALITY OF STACKED TRANSISTORS AND METHOD OF FABRICATING THE SAME

PRIORITY STATEMENT

This application is a divisional under 35 U.S.C. §121 of U.S. application Ser. No. 12/219,278, filed on Jul. 18, 2008 now U.S. Pat. No. 7,825,472, which claims priority under 35 U.S.C. §119 to Korean Patent Application No. 10-2007-0072964, filed on Jul. 20, 2007 with the Korean Intellectual Property Office (KIPO), the entire contents of each of which are incorporated herein by reference.

BACKGROUND

1. Technical Field

Example embodiments relate to a semiconductor device and a method of fabricating the same.

2. Description of the Related Art

A conventional semiconductor device has a plurality of bulk transistors which use the semiconductor substrate as a channel body layer. Consequently, the size of the bulk transistors must be reduced to increase the degree of integration. Although the size of bulk transistors have been reduced from improvements in photolithography, there is still a limit for increasing the degree of integration of semiconductor devices having bulk transistors arranged in a two-dimensional manner on a semiconductor substrate.

SUMMARY

Example embodiments relate to a semiconductor device having stacked thin film transistors (TFT) and a method of fabricating the same. The stacked TFTs of the semiconductor device may improve driving ability.

A semiconductor device according to example embodiments may include a lower insulating layer on a semiconductor substrate and an upper channel body pattern on the lower insulating layer. A source region and a drain region may be formed within the upper channel body pattern, and a non-metal transfer gate electrode may be disposed on the upper channel body pattern between the source and drain regions. The non-metal transfer gate electrode, the upper channel body pattern, and the lower insulating layer may be covered by an intermediate insulating layer. A metal word line may be disposed within the intermediate insulating layer so as to contact at least an upper surface of the non-metal transfer gate electrode. An insulating spacer may cover a sidewall of the metal word line. A metal node plug may be disposed within the intermediate insulating layer and the lower insulating layer so as to contact the source region of the upper channel body pattern.

The semiconductor device may further include a bulk transistor in the semiconductor substrate and a lower TFT within the lower insulating layer. The metal node plug may contact the drain region of the lower TFT and the drain region of the bulk transistor. The non-metal transfer gate electrode may be a polysilicon layer. The metal word line and the metal node plug may be tungsten layers.

An upper surface of the metal word line may be higher than an upper surface of the metal node plug. The combined width of the insulating spacer and the metal word line may be greater than the width of the non-metal transfer gate electrode. The metal word line may contact the upper surface and at least one sidewall of the non-metal transfer gate electrode.

Alternatively, the upper surface of the metal word line may be lower than the upper surface of the metal node plug. In such a case, the combined width of the insulating spacer and the metal word line may be about equal to the width of the non-metal transfer gate electrode. The metal word line may also be aligned with the non-metal transfer gate electrode.

The semiconductor device may further include a ground line, a power line, and a bit line on the intermediate insulating layer. The bit line may be electrically connected to the drain region of the upper channel body pattern.

A method of fabricating a semiconductor device having stacked TFTs may include forming a lower insulating layer on a semiconductor substrate and forming an upper channel body pattern on the lower insulating layer. A transfer gate pattern may be formed to traverse the upper channel body pattern. The transfer gate pattern may be formed to have a non-metal transfer gate electrode. Impurity ions may be implanted into the upper channel body pattern using the transfer gate pattern as an ion implantation mask to form a source region and a drain region. An intermediate insulating layer may be formed on the transfer gate pattern, the upper channel body pattern, and the lower insulating layer. A metal node plug may be formed so as to contact the source region of the upper channel body pattern in the intermediate insulating layer. A metal word line may be formed to contact an upper surface of the non-metal transfer gate electrode. An insulating spacer may also be formed to cover a sidewall of the metal word line in the intermediate insulating layer.

The non-metal transfer gate electrode may be formed of a polysilicon layer. The metal node plug and the metal word line may be formed of tungsten layers.

Forming the metal node plug may occur before forming the metal word line and the insulating spacer. In such a case, the intermediate insulating layer may be formed by sequentially stacking a first intermediate insulating layer and a second intermediate insulating layer. Forming the metal node plug may include forming a node contact hole through the first intermediate insulating layer and the lower insulating layer to expose the source region of the upper channel body pattern before forming the second intermediate insulating layer, forming a node metal layer on the first intermediate insulating layer and in the node contact hole, and/or planarizing the node metal layer to expose an upper surface of the first intermediate insulating layer.

Forming the metal word line and the insulating spacer may include patterning the first and second intermediate insulating layers to form a groove in the form of a line exposing at least an upper surface of the non-metal transfer gate electrode, forming an insulating spacer on a sidewall of the groove, forming a word line metal layer on the second intermediate insulating layer and in the groove surrounded by the insulating spacer, and/or planarizing the word line metal layer to expose an upper surface of the second intermediate insulating layer.

Alternatively, forming the metal node plug may occur after forming the metal word line and the insulating spacer. In such a case, the transfer gate pattern may be formed to have the non-metal transfer gate electrode and a gate capping pattern stacked on the non-metal transfer gate electrode. Forming the intermediate insulating layer may include forming a first intermediate insulating layer exposing an upper surface of the gate capping pattern and forming a second intermediate insulating layer on the first intermediate insulating layer. Forming the metal word line and the insulating spacer may include removing the exposed gate capping pattern to form a groove in the form of a line exposing an upper surface of the non-metal transfer gate electrode before forming the second intermediate insulating layer, forming an insulating spacer on a sidewall of the groove, forming a word line metal layer on the first intermediate insulating layer and in the groove surrounded by the insulating spacer, and/or planarizing the word line metal layer to expose an upper surface of the first intermediate insulating layer.

Forming the metal node plug may include forming a node contact hole through the second intermediate insulating layer, the first intermediate insulating layer, and the lower insulating layer to expose the source region of the upper channel body pattern, forming a node metal layer on the second intermediate insulating layer and in the node contact hole, and/or planarizing the node metal layer to expose an upper surface of the second intermediate insulating layer.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
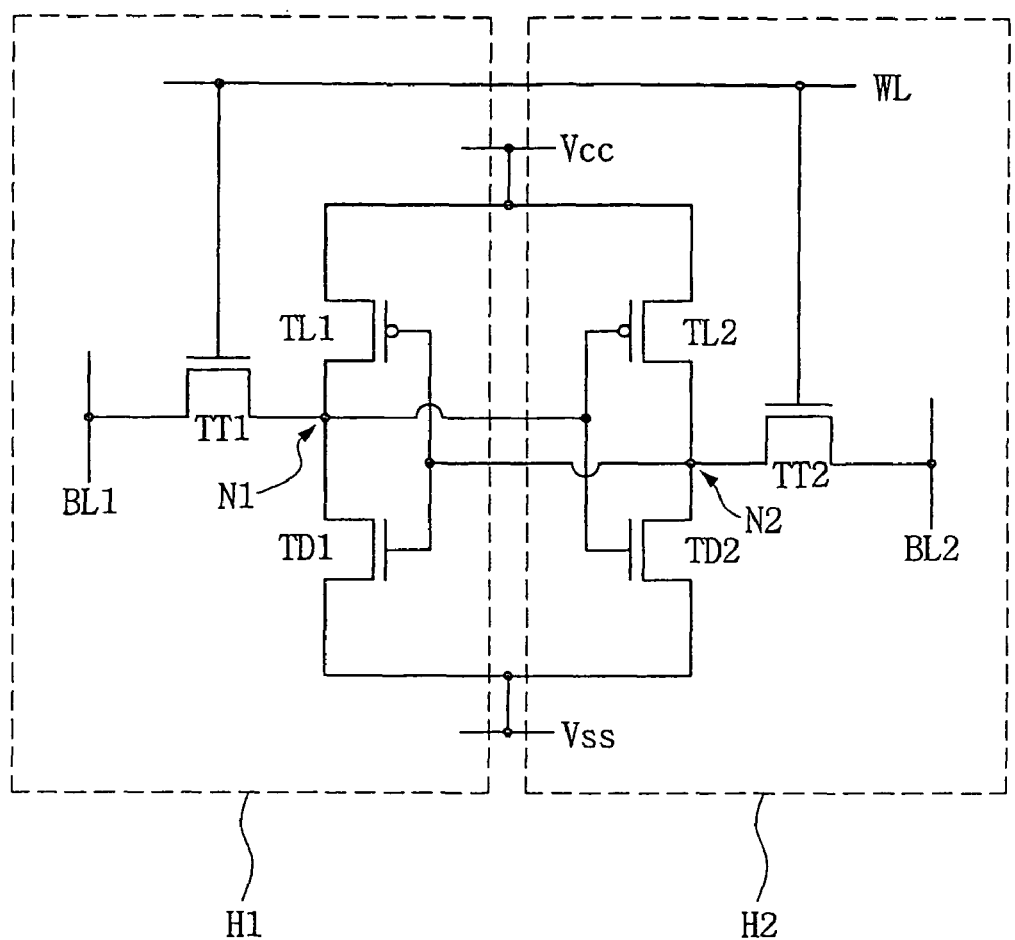
FIG. 1 is an equivalent circuit diagram of a complementary metal oxide semiconductor (CMOS) static random access memory (SRAM) cell according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is an equivalent circuit diagram of a complementary metal oxide semiconductor (CMOS) static random access memory (SRAM) cell according to example embodiments. Referring to FIG. 1, the CMOS SRAM cell may include a pair of first and second driver transistors TD1 and TD2, a pair of first and second transfer transistors TT1 and TT2, and a pair of first and second load transistors TL1 and TL2. The first and second driver transistors TD1 and TD2 and the first and second transfer transistors TT1 and TT2 may be NMOS transistors, while the first and second load transistors TL1 and TL2 may be PMOS transistors.

The first driver transistor TD1 and the first transfer transistor TT1 may be connected to each other in series. A source region of the first driver transistor TD1 may be electrically connected to a ground line Vss, and a drain region of the first transfer transistor TT1 may be electrically connected to a first bit line BL1. Similarly, the second driver transistor TD2 and the second transfer transistor TT2 may be connected to each other in series. A source region of the second driver transistor TD2 may be electrically connected to the ground line Vss, and a drain region of the second transfer transistor TT2 may be electrically connected to a second bit line BL2.

A source region and a drain region of the first load transistor TL1 may be electrically connected to a power supply line Vcc and a drain region of the first driver transistor TD1, respectively. Similarly, a source region and a drain region of the second load transistor TL2 may be electrically connected to the power supply line Vcc and a drain region of the second driver transistor TD2, respectively.

The drain region of the first load transistor TL1, the drain region of the first driver transistor TD1, and the source region of the first transfer transistor TT1 may correspond to a first node N1. Similarly, the drain region of the second load transistor TL2, the drain region of the second driver transistor TD2, and the source region of the second transfer transistor TT2 may correspond to a second node N2.

A gate electrode of the first driver transistor TD1 and a gate electrode of the first load transistor TL1 may be electrically connected to the second node N2. Similarly, a gate electrode of the second driver transistor TD2 and a gate electrode of the second load transistor TL2 may be electrically connected to the first node N1. Additionally, the gate electrodes of the first and second transfer transistors TT1 and TT2 may be electrically connected to a word line WL.

The first driver transistor TD1, the first transfer transistor TT1, and the first load transistor TL1 may constitute a first half-cell H1, and the second driver transistor TD2, the second transfer transistor TT2, and the second load transistor TL2 may constitute a second half-cell H2.

The CMOS SRAM cell according to example embodiments may have a larger noise margin and a smaller stand-by current compared to a conventional SRAM cell. Accordingly, the CMOS SRAM cell may be used in a higher performance SRAM that requires a lower power voltage. When the first and second transfer transistors TT1 and TT2 and the first and second load transistors TL1 and TL2 are stacked on the first and second drive transistors TD1 and TD2, respectively, the degree of integration of the SRAM device may be increased. The first and second drive transistors TD1 and TD2 may be bulk transistors formed in a semiconductor substrate. The stacked first and second transfer transistors TT1 and TT2 and the first and second load transistors TL1 and TL2 may be thin film transistors (TFT).

A TFT CMOS SRAM cell may have improved integration and latch-up immunity compared to a conventional bulk CMOS SRAM cell. A higher performance P-channel TFT may have a body pattern formed of a single crystal semiconductor layer. Additionally, ohmic contacts may be formed in the first and second nodes N1 and N2 shown in FIG. 1.

Figure 2:
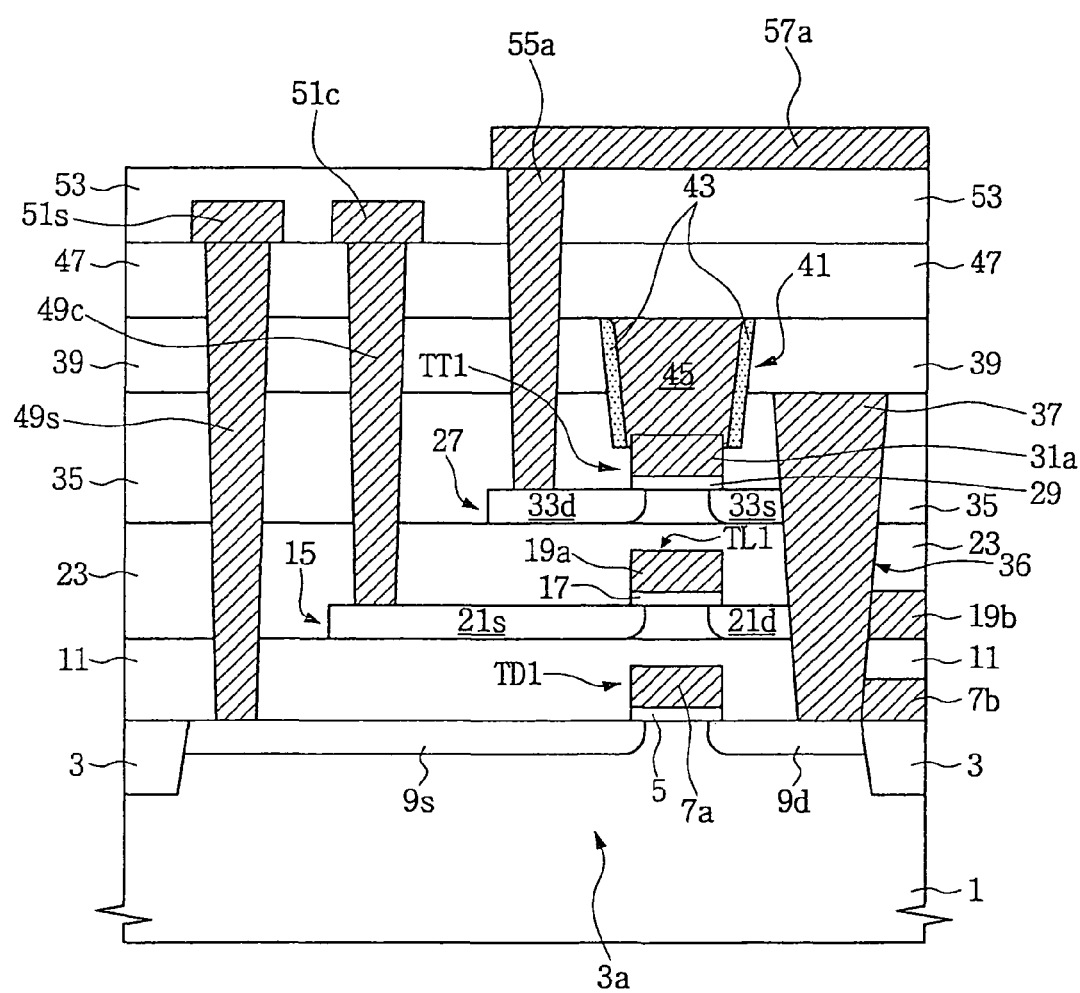
FIG. 2 is a cross-sectional view of a portion of a thin film transistor (TFT) CMOS SRAM cell according to example embodiments.

FIG. 2 is a cross-sectional view of a portion of a TFT CMOS SRAM cell according to example embodiments. The cross-sectional view of FIG. 2 may be representative of the first half-cell H1 of FIG. 1. Because the structure of the second half-cell H2 of FIG. 1 may be similar to the structure of the first half-cell H1, the description of the second half-cell H2 will be omitted for brevity.

Referring to FIG. 2, an isolation region 3 may be disposed in a predetermined region of a semiconductor substrate 1 to define an active region 3a. The semiconductor substrate 1 may be a single crystal semiconductor layer. For example, the semiconductor substrate 1 may be a single crystal silicon substrate. A first source region 9s and a first drain region 9d may be formed within the active region 3a. A first gate insulating layer 5 and a first driver gate electrode 7a may be sequentially stacked on a channel region between the first source region 9s and the first drain region 9d.

A portion (e.g., extension) of a second driver gate electrode 7b may be disposed on the isolation region 3 adjacent to the first drain region 9d. The first driver gate electrode 7a, the first source region 9s, and the first drain region 9d may constitute the first driver transistor TD1 shown in FIG. 1. The second driver gate electrode 7b may correspond to the gate electrode of the second driver transistor TD2 shown in FIG. 1. The first driver transistor TD1 may be an N-channel MOS transistor. The first source region 9s and the first drain region 9d may be N-type impurity regions.

The first driver transistor TD1, the second driver gate electrode 7b, and the isolation region 3 may be covered by a first lower insulating layer 11. A lower channel body pattern 15 may be disposed on the first lower insulating layer 11. A second source region 21s and a second drain region 21d may be provided within the lower channel body pattern 15. The lower channel body pattern 15 may be a semiconductor pattern (e.g., silicon pattern). A second gate insulating layer 17 and a first load gate electrode 19a may be sequentially stacked on the lower channel body pattern 15 between the second source region 21s and the second drain region 21d.

A portion (e.g., extension) of the second load gate electrode 19b may be disposed on the first lower insulating layer 11 adjacent to the second drain region 21d. The first load gate electrode 19a, the second source region 21s, and the second drain region 21d may constitute the first load transistor TL1 shown in FIG. 1. The second load gate electrode 19b may correspond to the gate electrode of the second load transistor TL2 shown in FIG. 1. The first load transistor TL1 may be a P-channel MOS transistor. The second source region 21s and the second drain region 21d may be P-type impurity regions.

The first load transistor TL1, the second load gate electrode 19b, and the first lower insulating layer 11 may be covered by a second lower insulating layer 23. An upper channel body pattern 27 may be disposed on the second lower insulating layer 23. A third source region 33s and a third drain region 33d may be provided within the upper channel body pattern 27. The upper channel body pattern 27 may be a semiconductor pattern (e.g., silicon pattern). A third gate insulating layer 29 and a first transfer gate electrode 31a may be sequentially stacked on the upper channel body pattern 27 between the third source region 33s and the third drain region 33d. The first transfer gate electrode 31a may be a non-metal conductive material layer. For example, the first transfer gate electrode 31a may be a doped polysilicon layer.

The first transfer gate electrode 31a, the third source region 33s, and the third drain region 33d may constitute the first transfer transistor TT1 shown in FIG. 1. The first transfer transistor TT1 may be an N-channel MOS transistor. The third source region 33s and the third drain region 33d may be N-type impurity regions.

The first transfer transistor TT1 and the second lower insulating layer 23 may be covered by a first intermediate insulating layer 35. The first drain region 9d, the second drain region 21d, the third source region 33s, the second driver gate electrode 7b, and the second load gate electrode 19b may be exposed by a first node contact hole 36 through the first intermediate insulating layer 35, the second lower insulating layer 23, and the first lower insulating layer 11. The first node contact hole 36 may be filled with a first node plug 37. The first node plug 37 may correspond to the first node N1 shown in FIG. 1. The first node plug 37 may electrically connect the first drain region 9d, the second drain region 21d, the third source region 33s, the second driver gate electrode 7b, and the second load gate electrode 19b. The first node plug 37 may be a metal plug (e.g., tungsten plug).

A second intermediate insulating layer 39 may be stacked on the first node plug 37 and the first intermediate insulating layer 35. At least an upper surface of the first transfer gate electrode 31a may be exposed by a word line groove 41 in the form of a line within the second intermediate insulating layer 39 and the first intermediate insulating layer 35. The word line groove 41 may have a greater width than the first transfer gate electrode 31a. In such a case, the word line groove 41 may expose the upper surface and at least one sidewall of the first transfer gate electrode 31a. An insulating spacer 43 may be provided on a sidewall of the word line groove 41. The word line groove 41 surrounded by the insulating spacer 43 may be filled with a word line 45. Thus, in the event that the word line groove 41 is misaligned so as to expose the first node plug 37, the word line 45 may still be electrically insulated from the first node plug 37 by the insulating spacer 43.

The word line 45 may be a metal line having a lower resistivity than the first transfer gate electrode 31a. For example, the word line 45 may be an interconnection formed of a metal layer (e.g., tungsten layer). Accordingly, the delay time of an electrical signal applied to the first transfer gate 31a through the metal word line 45 may be smaller than the delay time of an electrical signal applied to a conventional word line formed of a doped polysilicon layer or a polycide layer.

The word line 45 and the second intermediate insulating layer 39 may be covered by a first upper insulating layer 47. A power line 51c and a ground line 51s may be disposed on the first upper insulating layer 47. The ground line 51s may be electrically connected to the first source region 9s through a ground contact plug 49s. The ground contact plug 49s may penetrate through the first upper insulating layer 47, the first and second intermediate insulating layers 35 and 39, and the first and second lower insulating layers 11 and 23. The power line 51c may be electrically connected to the second source region 21s through a power contact plug 49c. The power contact plug 49c may penetrate through the first upper insulating layer 47, the first and second intermediate insulating layers 35 and 39, and the second lower insulating layer 23.

The ground line 51s, the power line 51c, and the first upper insulating layer 47 may be covered by a second upper insulating layer 53. A first bit line 57a may be disposed on the second upper insulating layer 53. The first bit line 57a may be electrically connected to the third drain region 33d through a bit line contact plug 55a. The bit line contact plug 55a may penetrate the first and second upper insulating layers 47 and 53 and the first and second intermediate insulating layers 35 and 39.

Figure 3:
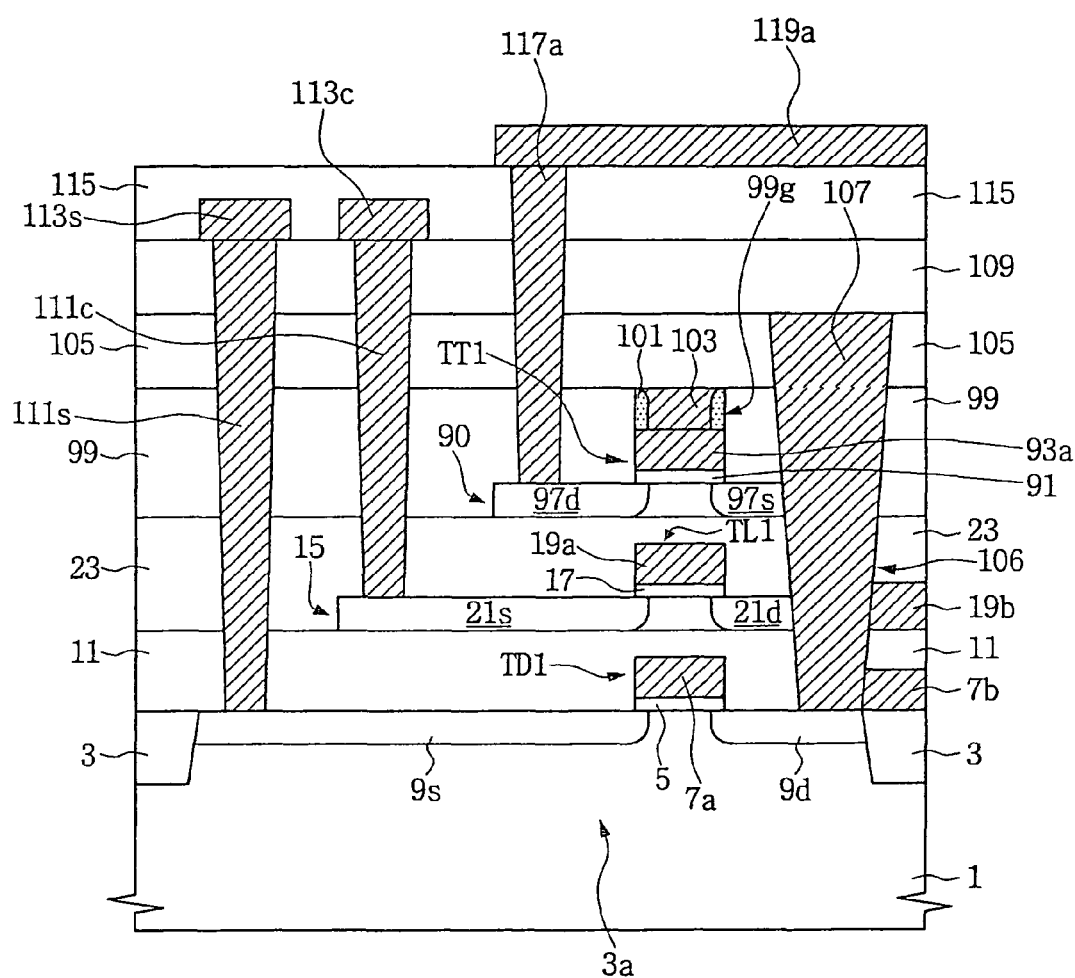
FIG. 3 is a cross-sectional view of a portion of another TFT CMOS SRAM cell according to example embodiments.

FIG. 3 is a cross-sectional view of a portion of another TFT CMOS SRAM cell according to example embodiments. The cross-sectional view of FIG. 3 may be representative of the first half-cell H1 of FIG. 1. The detailed description of various elements in FIG. 3, which are similar or identical to those already discussed above in connection with FIG. 2, may have been omitted for brevity.

Referring to FIG. 3, a first driver transistor TD1, a first load transistor TL1, a first lower insulating layer 11, a second lower insulating layer 23, a second driver gate electrode 7b, and a second load gate electrode 19b may be provided on a semiconductor substrate 1. An upper channel body pattern 90 may be provided on the second lower insulating layer 23. A third source region 97s and a third drain region 97d may be formed within the channel body pattern 90. A third gate insulating layer 91 and a first transfer gate electrode 93a may be sequentially stacked on the upper channel body pattern 90 between the third source region 97s and the third drain region 97d. The first transfer electrode 93a, the third source region 97s, and the third drain region 97d may constitute the first transfer transistor TT1 of FIG. 1. The first transfer gate electrode 93a may be formed of the same material layer as the first transfer gate electrode 31a of FIG. 2. For example, the first transfer gate electrode 93a may be formed of a non-metal conductive material layer (e.g., doped polysilicon layer).

The first transfer transistor TT1 and the second lower insulating layer 23 may be covered by a first intermediate insulating layer 99. An upper surface of the first transfer gate electrode 93a may be exposed by a word line groove 99g in the form of a line within the first intermediate insulating layer 99. The word line groove 99g may have approximately the same width as the first transfer gate electrode 93a. Additionally, the word line groove 99g may be aligned with the first transfer gate electrode 93a. An insulating spacer 101 may be formed on a sidewall of the word line groove 99g. The word line groove 99g surrounded by the insulating spacer 101 may be filled with a word line 103.

The word line 103 may be formed of the same material layer as the word line 45 of FIG. 2. For example, the word line 103 may be an interconnection formed of a metal layer (e.g., tungsten layer). Accordingly, the delay time of an electrical signal applied to the first transfer gate electrode 93a through the metal word line 103 may be smaller than the delay time of an electrical signal applied to a conventional word line formed of a doped polysilicon layer or a polycide layer.

The word line 103 and the first intermediate insulating layer 99 may be covered by a second intermediate insulating layer 105. The first drain region 9d, the second drain region 21d, the third source region 97s, the second driver gate electrode 7b, and the second load gate electrode 19b may be exposed by a first node contact hole 106 penetrating the second intermediate insulating layer 105, the first intermediate insulating layer 99, the second lower insulating layer 23, and the first lower insulating layer 11. The first node contact hole 106 may be filled with a first node plug 107. The first node plug 107 may correspond to the first node N1 of FIG. 1. The first node plug 107 may electrically connect the first drain region 9d, the second drain region 21d, the third source region 97s, the second driver gate electrode 7b, and the second load gate electrode 19b. The first node plug 107 may be a metal plug (e.g., tungsten plug).

The first node plug 107 and the second intermediate insulating layer 105 may be covered by a first upper insulating layer 109. A power line 113c and a ground line 113s may be disposed on the first upper insulating layer 109. The ground line 113s may be electrically connected to the first source region 9s through a ground contact plug 111s. The ground contact plug 111s may penetrate the first upper insulating layer 109, the first and second intermediate insulating layers 99 and 105, and the first and second lower insulating layers 11 and 23. The power line 113c may be electrically connected to the second source region 21s through a power contact plug 111c. The power contact plug 111c may penetrate the first upper insulating layer 109, the first and second intermediate insulating layers 99 and 105, and the second lower insulating layer 23.

The ground line 113s, the power line 113c, and the first upper insulating layer 109 may be covered by a second upper insulating layer 115. A first bit line 119a may be disposed on the second upper insulating layer 115. The first bit line 119a may be electrically connected to the third drain region 97d through a bit line contact plug 117a. The bit line contact plug 117a may penetrate the first and second upper insulating layers 109 and 115 and the first and second intermediate insulating layers 99 and 105.

A method of fabricating a TFT CMOS SRAM cell according to example embodiments will be described below. FIGS.

4 to 8 are cross-sectional views of a method of fabricating the TFT CMOS SRAM cell shown in FIG. 2.

Figure 4:
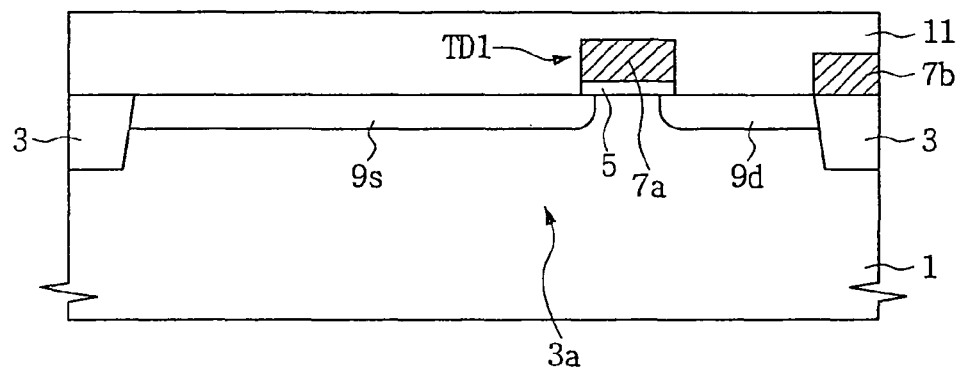
FIGS. 4 to 8 are cross-sectional views of a method of fabricating the TFT CMOS SRAM cell of FIG. 2.

Referring to FIG. 4, an isolation region 3 may be formed in a predetermined region of a semiconductor substrate 1 to define an active region 3a. A first driver transistor TD1 may be formed using the active region 3a as a channel body. The first driver transistor TD1 may be a bulk transistor. The first driver transistor TD1 may be formed to have a first gate insulating layer 5 and a first driver gate electrode 7a stacked on a channel region between a first source region 9s and a first drain region 9d within the active region 3a. The first source region 9s and the first drain region 9d may be N-type impurity regions. The first driver transistor TD1 may be an N-channel MOS transistor.

A portion (e.g., extension) of a second driver gate electrode 7b may be formed on the isolation region 3 adjacent to the first drain region 9d when the first driver gate electrode 7a is formed. The second driver gate electrode 7b may correspond to a gate electrode of a second driver transistor TD2 of FIG. 1. A first lower insulating layer 11 may be formed on the first driver transistor TD1, the second driver gate electrode 7b, and the isolation region 3.

Figure 5:
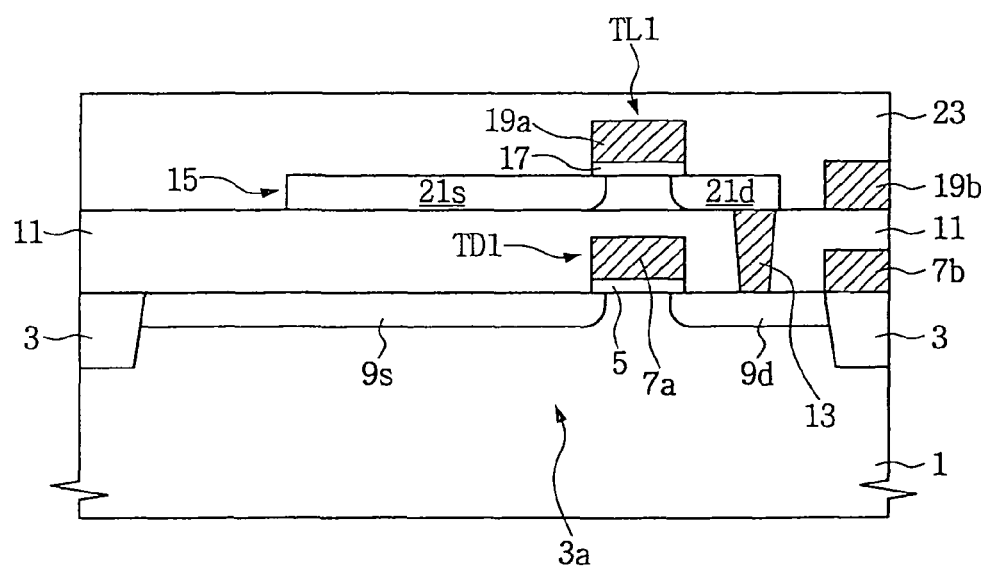

Referring to FIG. 5, the first lower insulating layer 11 may be patterned to form a lower node contact hole exposing the first drain region 9d. A lower node contact plug 13 (e.g., lower semiconductor plug) may be formed within the lower node contact hole. The lower node contact plug 13 may be formed using a selective epitaxial growth (SEG) technique which uses the first drain region 9d as a seed layer. When the first drain region 9d is a single crystal semiconductor layer, the lower node contact plug 13 may be a semiconductor plug having a single crystal structure.

A first load transistor TL1 may be formed on the first lower insulating layer 11 using a technique well-known in the art. For example, the first load transistor TL1 may be formed to have a lower channel body pattern 15 disposed on the first lower insulating layer 11. A second source region 21s and a second drain region 21d may be disposed within the lower channel body pattern 15. A second gate insulating layer 17 and a first load gate electrode 19a may be stacked on a channel region between the second source region 21s and the second drain region 21d.

The first load transistor TL1 may be a P-channel TFT. The second source region 21s and the second drain region 21d may be P-type impurity regions. The second drain region 21d may be formed on the lower node contact plug 13. A portion (e.g., extension) of the second load gate electrode 19b may be formed on the first lower insulating layer 11 adjacent to the second drain region 21d when the first load gate electrode 19a is formed. The second load gate electrode 19b may correspond to a gate electrode of the second load transistor TL2 of FIG. 1. A second lower insulating layer 23 may be formed on the first load transistor TL1, the second load gate electrode 19b, and the first lower insulating layer 11.

Figure 6A:
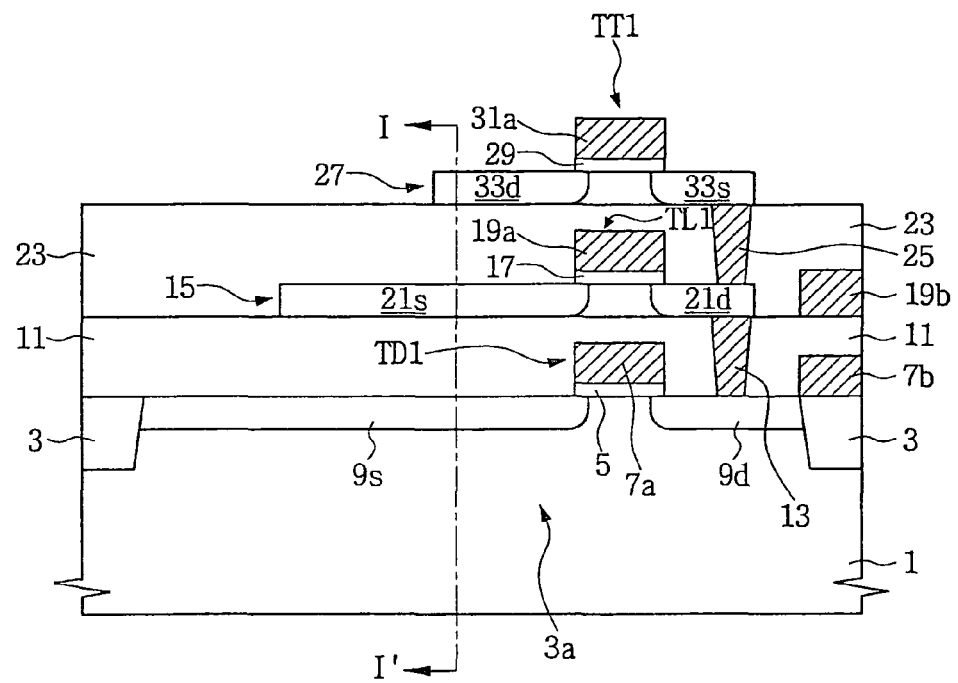
Figure 6B:
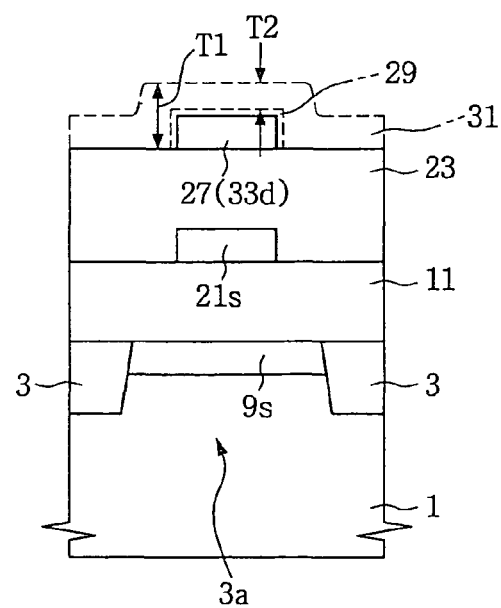

Referring to FIGS. 6A and 6B, an upper node contact plug 25 (e.g., upper semiconductor plug) may be formed within the second lower insulating layer 23. The upper node contact plug 25 may be in contact with the second drain region 21d. The upper node contact plug 25 may be formed with the same method used to form the lower node contact plug 13 as described above with reference to FIG. 5. FIG. 6B is a cross-sectional view taken along I-I' line of FIG. 6A.

An upper channel body pattern 27 (e.g., upper semiconductor pattern) may be formed on the second lower insulating layer 23. The upper channel body pattern 27 may be formed using an epitaxial technique which uses the upper node contact plug 25 as a seed layer. Accordingly, when the upper node contact plug 25 is a single crystal semiconductor plug, the upper channel body pattern 27 may be formed to have a single crystal structure.

A third gate insulating layer 29 may be formed on the surface of the upper channel body pattern 27. A gate conductive layer 31 may be formed on the third gate insulating layer 29 and the second lower insulating layer 23. The gate conductive layer 31 may also be formed on a sidewall of the upper channel body pattern 27 as shown in FIG. 6B. A first thickness T1 of the gate conductive layer 31 formed on the second lower insulating layer 23 adjacent to the sidewall of the upper channel body pattern 27 may be greater than a second thickness T2 of the gate conductive layer 31 formed on an upper surface of the upper channel body pattern 27.

The gate conductive layer 31 may be patterned to form a first transfer gate electrode 31a that traverses the upper channel body pattern 27. The first transfer gate electrode 31a may be formed by anisotropically etching the gate conductive layer 31. It may be beneficial to perform the anisotropic etch process relatively thoroughly to reduce or prevent residuals of the gate conductive layer 31 from remaining on the second lower insulating layer 23.

The thickness of the third gate insulating layer 29 may be reduced to improve electrical characteristics (e.g., switching characteristics) of the TFT to be formed in the upper channel body pattern 27. It may also be beneficial to increase the thickness of the upper channel body pattern 27 to improve the contact resistance of a node plug to be formed in contact with a sidewall of the upper channel body pattern 27 in a subsequent process. Because the gate conductive layer 31 may be formed of a non-metal conductive material layer (e.g., polysilicon layer) having a smaller thickness than a conventional gate conductive layer formed of a metal polycide layer, the etch damage inflicted on the upper channel body pattern 27 when patterning the gate conductive layer 31 may be reduced, thus helping to preserve the thickness of the upper channel body pattern 27.

When the gate conductive layer 31 is formed of a non-metal conductive material layer, the electrical resistance of the resulting first transfer gate electrode 31a may be increased. If the first transfer gate electrode 31a is used as a word line of a SRAM cell, then the SRAM cell may have decreased operation speed. Thus, an additional metal interconnection is used as the word line instead of the first transfer gate electrode 31a. The word line according to example embodiments will be described in further detail below.

Impurity ions (e.g., N-type impurity ions) may be implanted into the upper channel body pattern 27 using the first transfer gate electrode 31a as an ion implantation mask to form a third source region 33s and a third drain region 33d. The third source region 33s may be formed above the upper node contact plug 25. The first transfer gate electrode 31a, the third source region 33s, and the third drain region 33d may constitute the first transfer transistor TT1 of FIG. 1.

Figure 7:
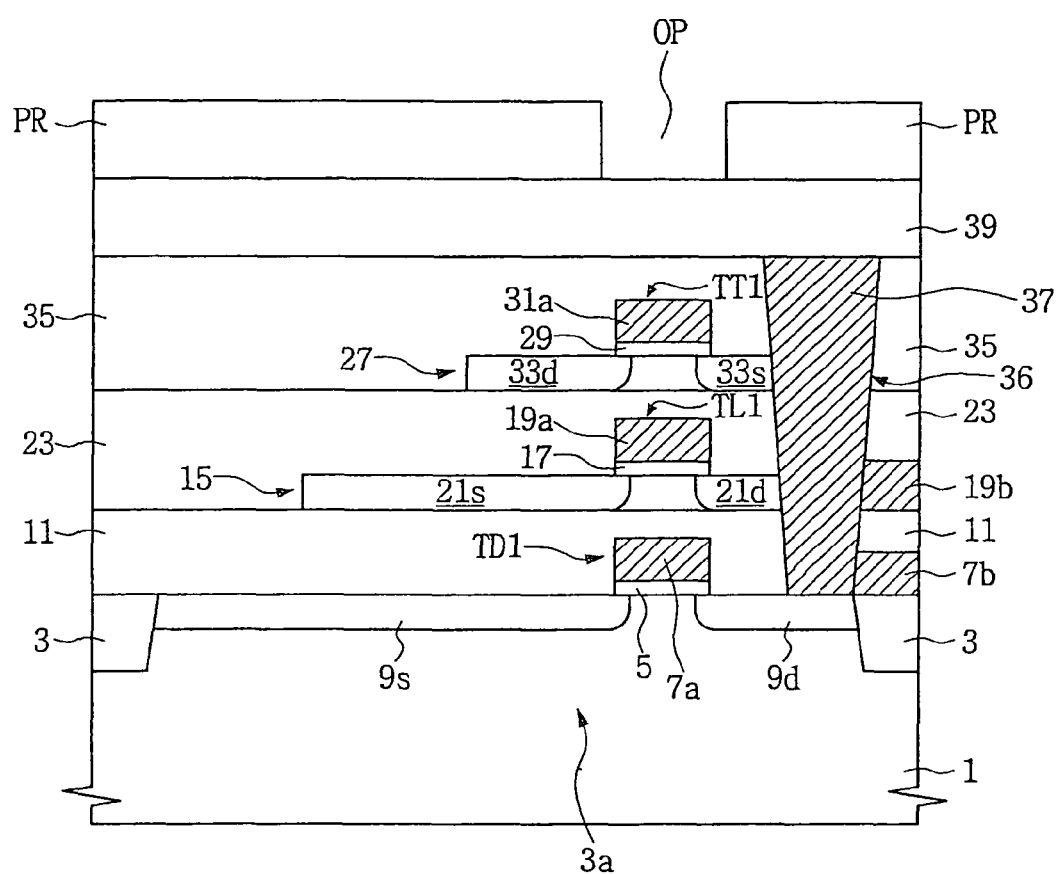

Referring to FIG. 7, a first intermediate insulating layer 35 may be formed on the first transfer transistor TT1 and the second lower insulating layer 23. The first intermediate insulating layer 35, the second lower insulating layer 23, and the first lower insulating layer 11 may be patterned to form a first node contact hole 36 exposing the third source region 33s, the second drain region 21d, the first drain region 9d, the second load gate electrode 19b, and the second driver gate electrode 7b. The upper and lower node contact plugs 13 and 25 may be etched during the formation of the first node contact hole 36. A first node plug 37 may be formed within the first node contact hole 36. The first node plug 37 may be formed of a metal layer (e.g., tungsten layer).

A second intermediate insulating layer 39 may be formed on the first node plug 37 and the first intermediate insulating layer 35. A photoresist pattern PR may be formed on the second intermediate insulating layer 39. The photoresist pattern PR may be formed to have an opening OP in the form of a line positioned above the first transfer gate electrode 31a. The opening OP may have a greater width than the first transfer gate electrode 31a.

Figure 8:
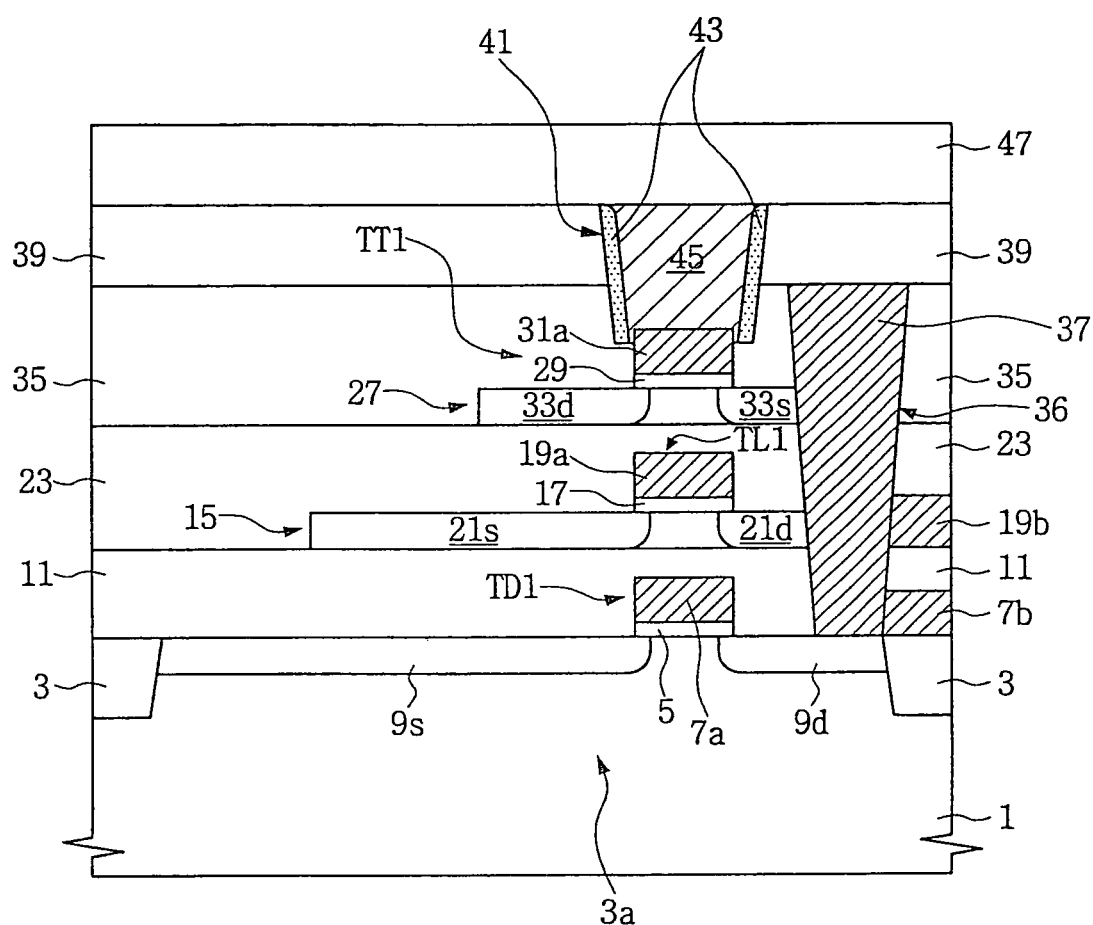

Referring to FIG. 8, the second intermediate insulating layer 39 and the first intermediate insulating layer 35 may be etched using the photoresist pattern PR of FIG. 7 as an etch mask to form a groove 41 in the form of a line which exposes at least an upper surface of the first transfer gate electrode 31a. When the groove 41 has a greater width than the first transfer gate electrode 31a, at least one sidewall of the first transfer gate electrode 31a may also be exposed. The groove 41 may be formed in parallel with the first transfer gate electrode 31a. An insulating spacer 43 may be formed on a sidewall of the groove 41. A word line 45 may be formed within the groove 41 surrounded by the insulating spacer 43. The word line 45 may be formed of a metal layer (e.g., tungsten layer).

An electrical signal may be applied to the first transfer gate electrode 31a through the metal word line 45. Accordingly, the first transfer transistor TT1 may have a faster operation speed than a conventional transfer transistor employing a metal polycide layer as a transfer gate electrode. The faster operation speed may be attributable to the metal word line 45 having a lower resistivity than a metal silicide constituting the metal polycide layer. Additionally, in the event that the groove 41 is misaligned so as to expose the first node plug 37, the metal word line 45 may still be electrically insulated from the first node plug 37 by the insulating spacer 43.

A first upper insulating layer 47 may be formed on the metal word line 45 and the second intermediate insulating layer 39. A power line 51c, a ground line 51s, a second upper insulating layer 53, and a first bit line 57a may formed on the first upper insulating layer 47 to achieve the TFT CMOS SRAM cell shown in FIG. 2. The power line 51c, the ground line 51s, the second upper insulating layer 53, and the first bit line 57a may be formed by a method well-known in the art.

Figure 9:
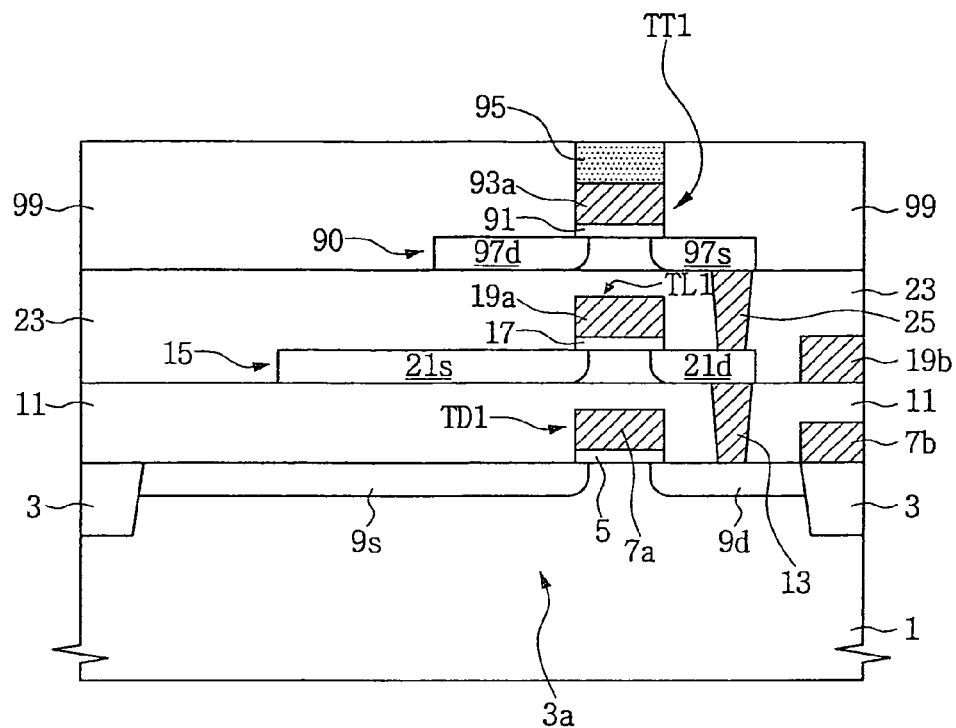
FIGS. 9 to 11 are cross-sectional views of a method of fabricating the TFT CMOS SRAM cell of FIG. 3.
Figure 10:
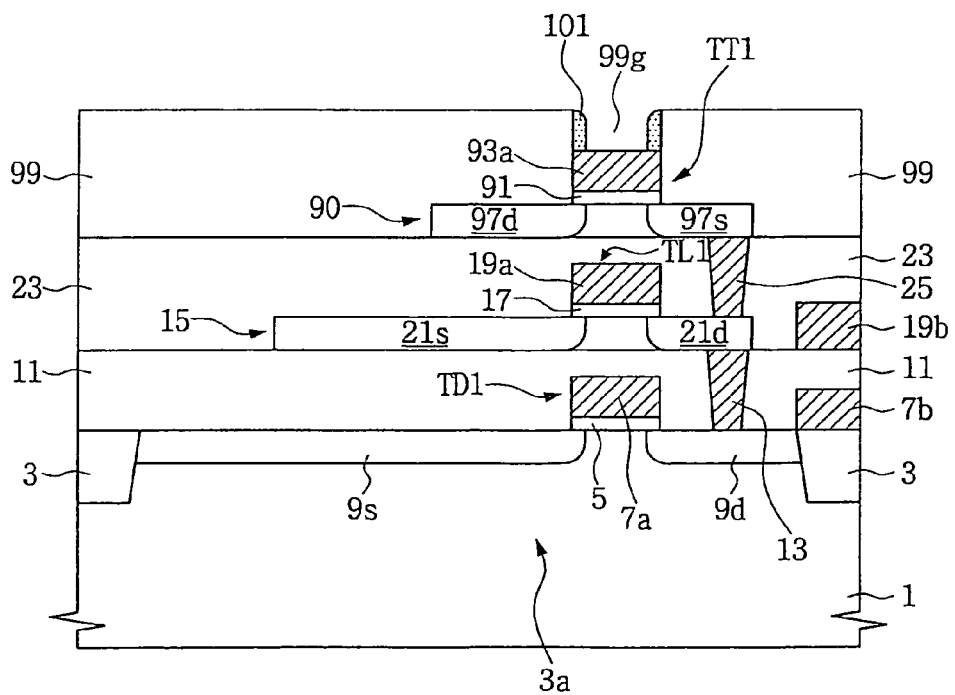
Figure 11:
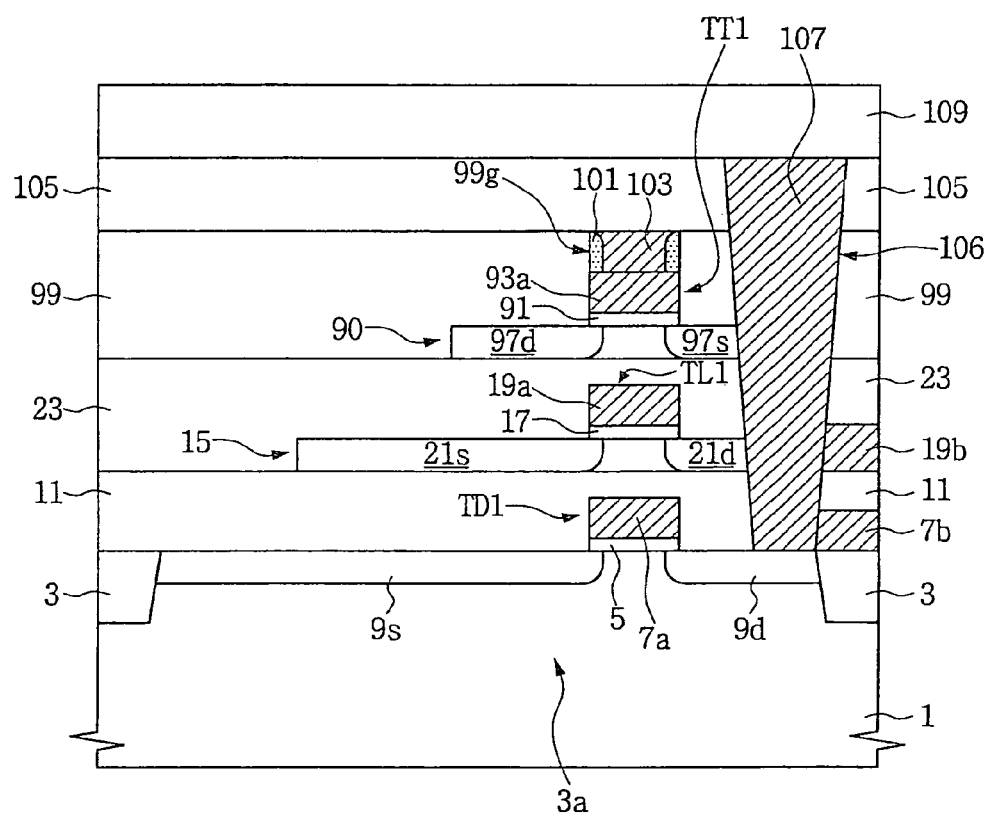

FIGS. 9 to 11 are cross-sectional views of a method of fabricating the TFT CMOS SRAM cell shown in FIG. 3. Referring to FIG. 9, a first driver transistor TD1, a first lower insulating layer 11, a lower node contact plug 13, a first load transistor TL1, a second lower insulating layer 23, and an upper node contact plug 25 may be formed on the semiconductor substrate 1. The first driver transistor TD1, the first lower insulating layer 11, the lower node contact plug 13, the first load transistor TL1, the second lower insulating layer 23, and the upper node contact plug 25 may be formed by the same method as described with reference to FIGS. 4 to 6.

An upper channel body pattern 90 (e.g., upper semiconductor pattern) may be formed on the second lower insulating layer 23. The upper channel body pattern 90 may be formed by the same method used to form the upper channel body pattern 27 as described with reference to FIGS. 6A and 6B. A third gate insulating layer 91 may be formed on a surface of the upper channel body pattern 90. A gate conductive layer and a gate capping insulating layer may be sequentially formed on the third gate insulating layer 91 and the second lower insulating layer 23. The gate conductive layer may be formed of a non-metal conductive material layer (e.g., doped polysilicon layer).

The gate capping insulating layer and the gate conductive layer may be patterned to form a first transfer gate electrode 93a and a gate capping pattern 95 which traverse the upper channel body pattern 90. The first transfer gate electrode 93a and the gate capping pattern 95 may have the form of a line. The gate conductive layer may be formed of a non-metal conductive material layer as described above. Accordingly, the etch damage inflicted on the upper channel body pattern 90 when forming the first transfer gate electrode 93a may be reduced.

Impurity ions (e.g., N-type impurity ions) may be implanted into the upper channel body pattern 90 using the first transfer gate electrode 93a and the gate capping pattern 95 as an ion implantation mask to form a third source region 97s and a third drain region 97d. The third source region 97s may be formed above the upper node contact plug 25. The first transfer gate electrode 93a, the third source region 97s, and the third drain region 97d may constitute the first transfer transistor TT1 of FIG. 1. An insulating layer may be formed on the first transfer transistor TT1 and the second lower insulating layer 23. The insulating layer may be planarized to form a first intermediate insulating layer 99 which exposes an upper surface of the gate capping pattern 95. The gate capping pattern 95 may be formed of an insulating layer having an etching selectivity with respect to the first intermediate insulating layer 99. For example, when the first intermediate insulating layer 99 is formed of a silicon oxide layer, the gate capping pattern 95 may be formed of a silicon nitride layer or a silicon oxynitride layer.

Referring to FIG. 10, the exposed gate capping pattern 95 may be removed to form a groove 99g in the form of a line exposing an upper surface of the first transfer gate electrode 93a. The groove 99g may be aligned with the first transfer gate electrode 93a. An insulating spacer 101 may be formed on a sidewall of the groove 99g.

Referring to FIG. 11, a metal layer (e.g., tungsten layer) may be formed within the groove 99g and on the first intermediate insulating layer 99. The metal layer may be planarized to form a metal word line 103 in the form of a line within the groove 99g. The metal word line 103 may have a lower resistivity than a metal silicide layer constituting a conventional metal polycide layer. Accordingly, the transfer speed of an electrical signal applied to the first transfer gate electrode 93a through the metal word line 103 may be faster than a conventional arrangement involving a metal polycide layer as the first transfer gate electrode.

A second intermediate insulating layer 105 may be formed on the metal word line 103 and the first intermediate insulating layer 99. The second intermediate insulating layer 105, the first intermediate insulating layer 99, the second lower insulating layer 23, and the first lower insulating layer 11 may be patterned to form a first node contact hole 106 exposing the third source region 97s, the second drain region 21d, the first drain region 9d, the second load gate electrode 19b, and the second driver gate electrode 7b. The upper and lower node contact plugs 13 and 25 may be etched when the first node contact hole 106 is formed. A first node plug 107 may be formed within the first node contact hole 106. The first node plug 107 may be formed of a metal layer (e.g., tungsten layer).

In the event the first node contact hole 106 is misaligned so as to be adjacent to the metal word line 103 and the first transfer gate electrode 93a, the probability of an electrical shortage between the first node plug 107 and the metal word line 103 may be reduced by the presence of the insulating spacer 101.

A first upper insulating layer 109 may be formed on the first node plug 107 and the second intermediate insulating layer 105. A power line 113c, a ground line 113s, a second upper insulating layer 115, and a first bit line 119a may be formed on the first upper insulating layer 109 to achieve the TFT CMOS SRAM cell shown in FIG. 3. The power line 113c, the ground line 113s, the second upper insulating layer 115, and the first bit line 119a may be formed by a method well-known in the art.

According to example embodiments, a gate electrode of a TFT functioning as a transfer transistor may be formed of a non-metal conductive material layer. Accordingly, etch damage inflicted on a body pattern of the transfer transistor (e.g., during an etch process for patterning the transfer gate electrode) may be reduced. A metal interconnection in the form of a line may be formed on the transfer gate electrode to reduce an electrical resistance of the word line. As a result, the delay time of an electrical signal applied to the transfer gate electrode may be reduced, thus improving the operation speed of the transfer transistor. An insulating spacer may be formed on a sidewall of a metal word line stacked on the transfer gate electrode. Accordingly, the insulating spacer may reduce or prevent the occurrence of an electrical shortage between the metal word line and a metal node plug adjacent to the metal word line.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of fabricating a semiconductor device, comprising:
    forming a lower insulating layer on a semiconductor substrate;
    forming an upper channel body pattern on the lower insulating layer;
    forming a transfer gate pattern traversing the upper channel body pattern, the transfer gate pattern having a non-metal transfer gate electrode;
    implanting impurity ions into the upper channel body pattern using the transfer gate pattern as an ion implantation mask to form a source region and a drain region;
    forming an intermediate insulating layer on the transfer gate pattern, the upper channel body pattern, and the lower insulating layer;
    forming a metal node plug contacting the source region of the upper channel body pattern in the intermediate insulating layer; and
    forming a metal word line contacting at least one sidewall and an upper surface of the non-metal transfer gate electrode and an insulating spacer covering a sidewall of the metal word line in the intermediate insulating layer.

2. The method according to claim 1, wherein the lower insulating layer is formed by sequentially stacking a first lower insulating layer and a second lower insulating layer.

3. The method according to claim 2, further comprising:
    forming a bulk transistor in the semiconductor substrate before forming the first lower insulating layer; and
    forming a lower thin film transistor on the first lower insulating layer before forming the second lower insulating layer,
    wherein the metal node plug contacts a drain region of the bulk transistor and a drain region of the lower thin film transistor.

4. The method according to claim 1, wherein the non-metal transfer gate electrode is formed of a polysilicon layer.

5. The method according to claim 1, wherein the metal node plug and the metal word line are formed of tungsten layers.

6. The method according to claim 1, wherein forming the metal node plug occurs before forming the metal word line and the insulating spacer.

7. The method according to claim 6, wherein the intermediate insulating layer is formed by sequentially stacking a first intermediate insulating layer and a second intermediate insulating layer.

8. The method according to claim 7, wherein forming the metal node plug includes:
    forming a node contact hole through the first intermediate insulating layer and the lower insulating layer to expose the source region of the upper channel body pattern before forming the second intermediate insulating layer;
    forming a node metal layer on the first intermediate insulating layer and in the node contact hole; and
    planarizing the node metal layer to expose an upper surface of the first intermediate insulating layer.

9. The method according to claim 7, wherein forming the metal word line and the insulating spacer includes:
    patterning the first and second intermediate insulating layers to form a groove in the form of a line exposing at least an upper surface of the non-metal transfer gate electrode;
    forming an insulating spacer on a sidewall of the groove;
    forming a word line metal layer on the second intermediate insulating layer and in the groove surrounded by the insulating spacer; and
    planarizing the word line metal layer to expose an upper surface of the second intermediate insulating layer.

10. The method according to claim 1, wherein forming the metal node plug occurs after forming the metal word line and the insulating spacer.

11. The method according to claim 10, wherein the transfer gate pattern is formed to have the non-metal transfer gate electrode and a gate capping pattern stacked on the non-metal transfer gate electrode,
    forming the intermediate insulating layer includes forming a first intermediate insulating layer exposing an upper surface of the gate capping pattern; and forming a second intermediate insulating layer on the first intermediate insulating layer; and
    forming the metal word line and the insulating spacer includes removing the exposed gate capping pattern to form a groove in the form of a line exposing an upper surface of the non-metal transfer gate electrode before forming the second intermediate insulating layer; forming an insulating spacer on a sidewall of the groove; forming a word line metal layer on the first intermediate insulating layer and in the groove surrounded by the insulating spacer; and planarizing the word line metal layer to expose an upper surface of the first intermediate insulating layer.

12. The method according to claim 11, wherein forming the metal node plug includes:
    forming a node contact hole through the second intermediate insulating layer, the first intermediate insulating layer, and the lower insulating layer to expose the source region of the upper channel body pattern,
    forming a node metal layer on the second intermediate insulating layer and in the node contact hole, and
    planarizing the node metal layer to expose an upper surface of the second intermediate insulating layer.

* * * * *